(12) United States Patent
Lai et al.

(10) Patent No.: US 7,585,399 B1
(45) Date of Patent: Sep. 8, 2009

(54) ROTATING MAGNET ARRAYS FOR MAGNETRON SPUTTERING APPARATUS

(75) Inventors: Kwok F. Lai, Palo Alto, CA (US); Houchin Tang, legal representative, San Jose, CA (US); Kang Song, San Jose, CA (US); Douglas B. Hayden, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 802 days.

(21) Appl. No.: 11/097,464

(22) Filed: Mar. 31, 2005

(51) Int. Cl.
*C23C 14/00* (2006.01)
(52) U.S. Cl. .......................... 204/298.16; 204/298.19; 204/298.2; 204/298.12
(58) Field of Classification Search ............ 204/298.19, 204/298.2
See application file for complete search history.

(56) References Cited

U.S. PATENT DOCUMENTS

| | | | |
|---|---|---|---|
| 5,164,063 A * | 11/1992 | Braeuer et al. ........... 204/298.2 |
| 5,252,194 A | 10/1993 | Demaray et al. |
| 5,458,759 A * | 10/1995 | Hosokawa et al. ....... 204/298.2 |
| 6,258,217 B1 * | 7/2001 | Richards et al. ........ 204/192.12 |
| 6,683,425 B1 | 1/2004 | Lai |

FOREIGN PATENT DOCUMENTS

JP         63109163 A  *  5/1988

* cited by examiner

*Primary Examiner*—Nam X Nguyen
*Assistant Examiner*—John Brayton
(74) *Attorney, Agent, or Firm*—Okamoto & Benedicto LLP

(57) ABSTRACT

In one embodiment, a magnetron sputtering apparatus includes one or more magnet arrays for moving ions or charged particles on at least two plasma discharge paths on a target. Charged particles on one of the plasma discharge paths are moved in one direction, while charged particles on the other plasma discharge path are moved in the opposite direction to reduce rotational shifting of deposition flux on the patterned substrates. The plasma discharge paths may be formed by two symmetric magnet arrays or a single asymmetric magnet array rotated from behind the target.

10 Claims, 8 Drawing Sheets

ROTATING MAGNET ARRAYS FOR MAGNETRON SPUTTERING APPARATUS

BACKGROUND OF THE INVENTION

1. Field of the Invention

The present invention relates generally to integrated circuit fabrication, and more particularly but not exclusively to methods and apparatus for magnetron sputtering.

2. Description of the Background Art

Physical vapor deposition (PVD) has been widely used in forming films on a wafer surface during fabrication of integrated circuits. PVD involves physical vaporization of atoms from a target surface using bombarding energetic particles that are usually ions of a gaseous material accelerated in an electric field. Planar magnetron sputtering uses a magnetic field to confine the motion of secondary electrons to near the target surface. An example planar magnetron sputtering apparatus 100 is schematically shown in FIG. 1.

In the planar magnetron sputtering apparatus 100, a substrate 112 is supported by a pedestal 110. Substrate 112 may be a semiconductor wafer, while the pedestal 110 may be a chuck that is vertically moveable towards a target 120. The planar target 120 comprises a material to be deposited on the substrate 112. The target 120 may comprise aluminum, titanium, tungsten, or tantalum, for example. A main magnet assembly 122 is placed behind the target 120 to generate the main magnetic fields for sputtering. The main magnet assembly 122, which has a conventional asymmetric configuration, is rotated by a motor 124 at a rate of about 2 revolutions per second. A magnetic field is superposed on the cathode with the target 120 in a sputtering chamber filled with Ar (argon) gas. Ar ions generated in the glow discharge are accelerated at the cathode and sputter the target 120, resulting in the deposition of thin films on the substrate 112.

A problem with the magnetron sputtering apparatus 100 is that the deposited films tend to shift from their intended location on the patterned substrate. FIG. 2 shows a plot 200 illustrating a rotational shift problem, in which the lines rotating in the counter-clockwise direction represent movement of the deposition flux on a substrate centered at zero (0,0) coordinates. The plot 200 is a vector plot, and the scale of the vectors is not shown for clarity of illustration (note that the shift is in the order of microns). The rotational shift illustrated in FIG. 2 increases with increasing radius and the magnitude of the shift changes throughout the life of the target. This shifting problem affects different features including alignment marks employed in lithography. Unless the rotational shift is prevented, minimized, or counteracted, alignment marks will shift on the substrate with each deposition step. Although alignment mark shifts may be compensated by adjustments in the lithography process, the problem becomes more difficult to deal with as feature sizes get smaller and the deposited films get thicker.

SUMMARY

In one embodiment, a magnetron sputtering apparatus includes one or more magnet arrays for moving ions or charged particles on at least two plasma discharge paths on a target. Charged particles on one of the plasma discharge paths are moved in one direction, while charged particles on the other plasma discharge path are moved in the opposite direction to offset shifting of deposition flux on a substrate. The plasma discharge paths may be formed by two symmetric magnet arrays rotated from behind the target. A single asymmetric magnet array may also be used to reduce most of the rotational shift.

These and other features of the present invention will be readily apparent to persons of ordinary skill in the art upon reading the entirety of this disclosure, which includes the accompanying drawings and claims.

The use of the same reference label in different drawings indicates the same or like components.

DETAILED DESCRIPTION

In the present disclosure, numerous specific details are provided, such as examples of apparatus, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 3:
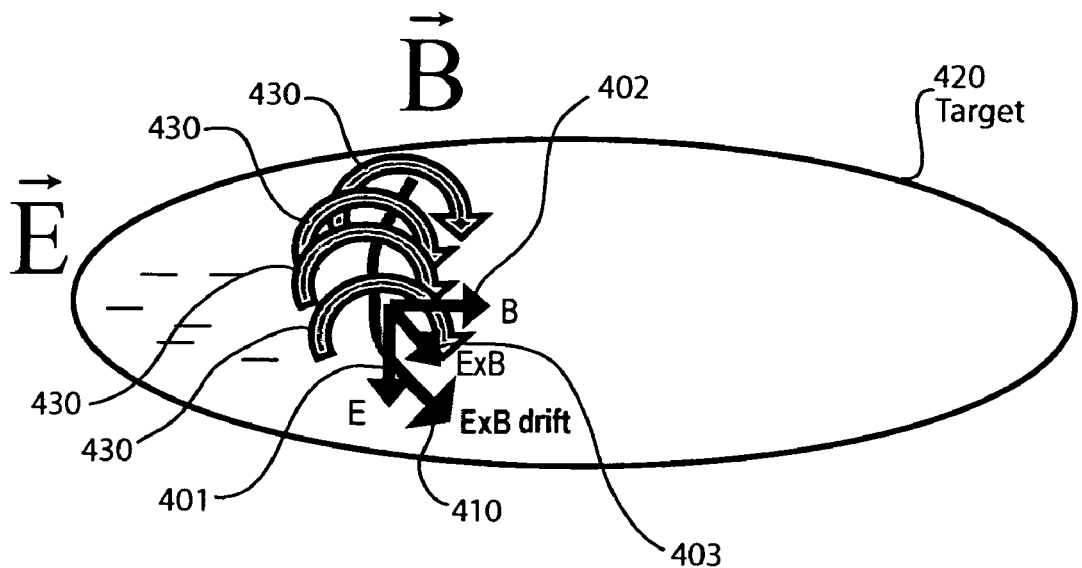
FIGS. 3-5 schematically illustrate the mechanism the inventors believe causes or contributes to rotational shifting of features in a magnetron sputtering apparatus.
Figure 4:
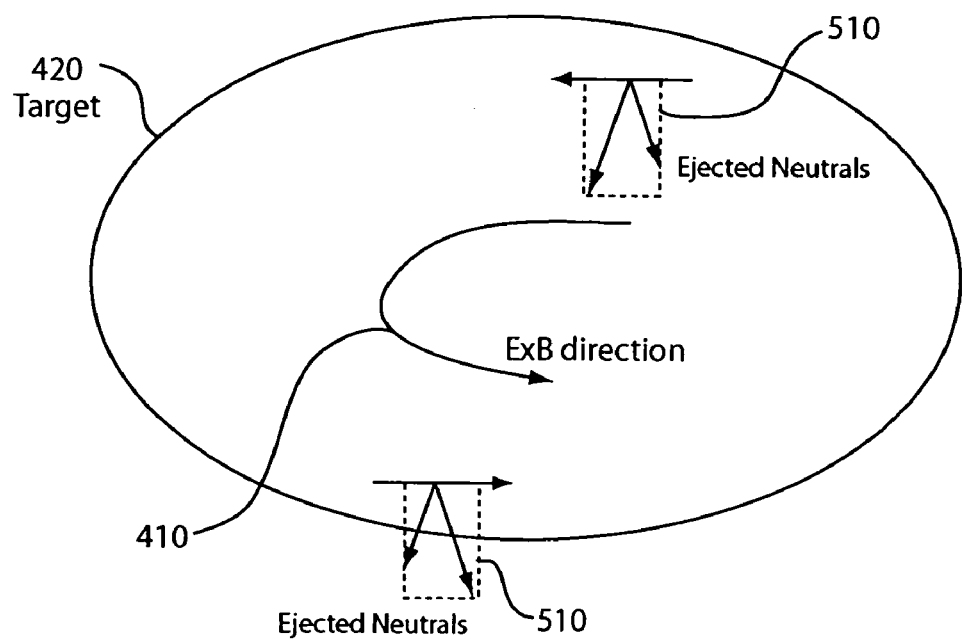
Figure 5:
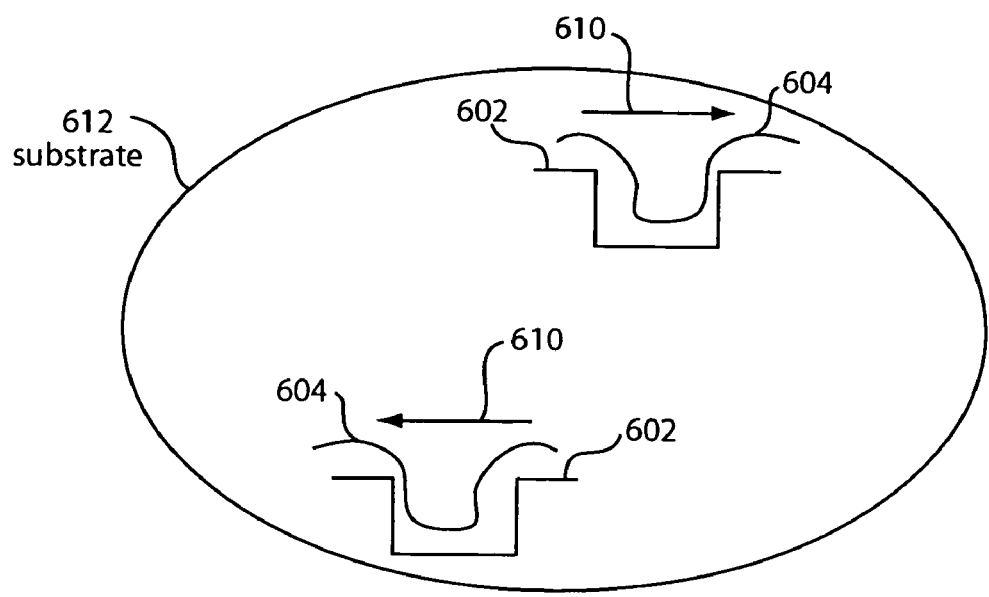

Without being limited by theory, the mechanism that the inventors believe causes or contributes to the aforementioned shift problem is now discussed with reference to the schematic illustrations of FIGS. 3-5. Referring first to FIG. 3, the movement of charge particles on the face of a target 420 is influenced by plasma discharge paths, which are also referred to as "magnetron racetracks." A plasma discharge path may be formed between north and south poles of looping magnets located behind the target 420 (i.e., side of target facing away from the substrate). A plasma discharge path is the path along which sputtering of the target occurs. In the example illustration of FIG. 3, arrows 430 represent magnetic fields generated by looping magnets. The region bounded by the arrows 430 on the target 420 is a plasma discharge path. Charged particles moving along a plasma discharge path have a velocity component resulting from the cross product of electric (E) and magnetic (B) fields near the target surface. This effect is also referred to as "E×B drift." An instance of an E×B drift is represented in FIG. 3 by a vector 403, which is due to the cross product of an electric field vector 401 and a magnetic field vector 402. An E×B drift has a magnitude and direction that moves charged particles along a plasma discharge path, as illustrated by E×B drift 410.

As is evident from above, Ar ion species used to sputter the target 420 have a non-perpendicular component as they impinge upon the target 420. The non-perpendicular component of ions affect the trajectory of neutral species to the extent that the sputter distribution of neutrals become forward peaked, rather than a strictly cosine distribution. FIG. 4 schematically illustrates the sputter distributions 510 of neutrals sputtered from the target 420 relative to the direction of the E×B drift 410. FIG. 5 schematically illustrates the result of a rotational drift on a substrate 612. In the example of FIG. 5, the rotational drift on the substrate 612 is in a direction indicated by arrows 610. The rotational drift results in deposited films 604 tending to form more towards one end of features 602 in the direction of the arrows 610. Features 602 are illustrated as vias, but may also be other features such as alignment marks.

Figure 6:
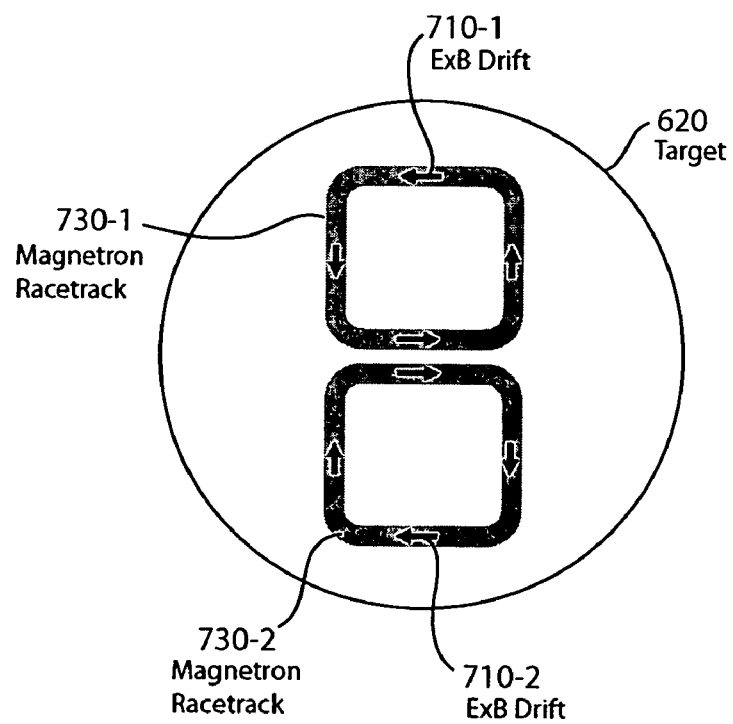
FIG. 6 schematically shows opposite plasma discharge paths formed on a target in accordance with an embodiment of the present invention.

Turning now to FIG. 6, there are shown plasma discharge paths 730 (i.e., 730-1, 730-2) formed on a target 620 in accordance with an embodiment of the present invention. In the example of FIG. 6, the rotational drift is balanced by having two plasma discharge paths 730 having substantially equal but opposite positions and directions. The plasma discharge path 730-1 may be formed by first magnetic fields from a first magnetic array located behind the target 620. The first magnetic fields may contribute to a velocity component, such as an E×B drift 710-1, to move charged particles or ions along the plasma discharge path 730-1. The plasma discharge path 730-2 may be formed by second magnetic fields from a second magnetic array also located behind the target 620. The second magnetic fields may generate another velocity component, such as E×B drift 710-2, to move charged particles or ions along the plasma discharge path 730-2. To balance any rotational shifting, the plasma discharge path 730-1 is positioned symmetric (in this example, mirror-image) to the plasma discharge path 730-2, while the E×B drift 710-1 has a magnitude substantially equal and a direction opposite to those of E×B drift 710-2. This advantageously results in the number of neutrals drifting in one direction to be substantially balanced by the number of neutrals going in the opposite direction. The first and second magnet arrays may be rotated from behind the target 620 to average their sputtering effect across the target 620. In the example of FIG. 6, the plasma discharge paths 730 are closed-loop paths.

Figure 7:
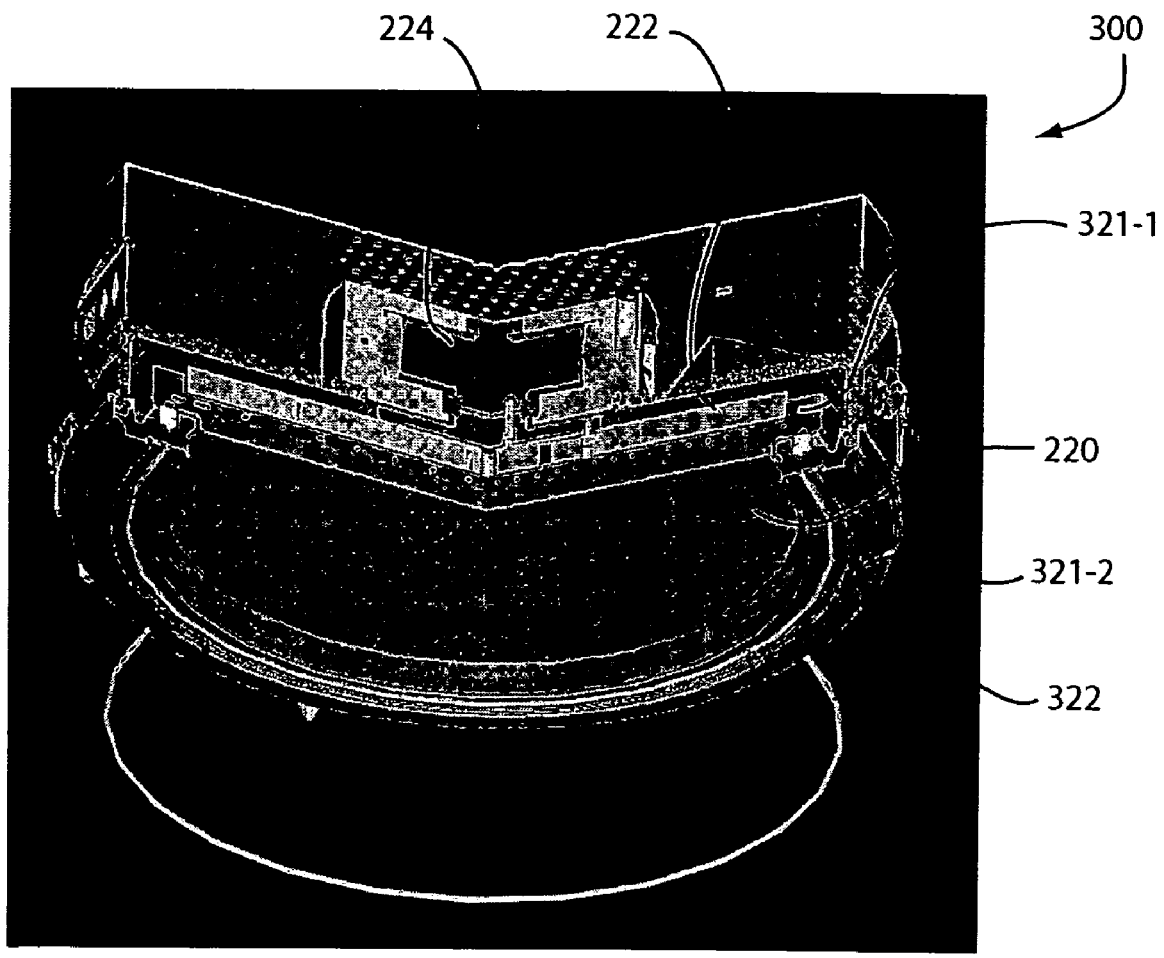
FIG. 7 schematically shows a planar magnetron source in accordance with an embodiment of the present invention.

FIG. 7 schematically shows a magnetron source 300 in accordance with an embodiment of the present invention. In the example of FIG. 7, the magnetron source 300 includes a target 220 and a rotating main magnet assembly 222. The main magnet assembly 222 is rotated by a motor 224 from behind the target 220 (i.e., from the backside of the target 220). The front or sputtering side of the target 220 faces a substrate placed in a chamber (not shown). A target housing 321 (i.e., 321-1, 321-2), which may be a one piece or multi-piece housing, supports the target 220. The portion 321-2 of the target housing is positioned to enclose the chamber. O-rings 322 (one of which is shown as separated from portion 321-2 for clarity) sit on grooves on portion 321-2 of the target housing to help create a vacuum seal between the chamber and the source 300. Portion 321-1 of the target housing may include a cooling plate to help cool the target 220 during operation. The target 220 may comprise a substantially planar target made of aluminum, for example.

Figure 8:
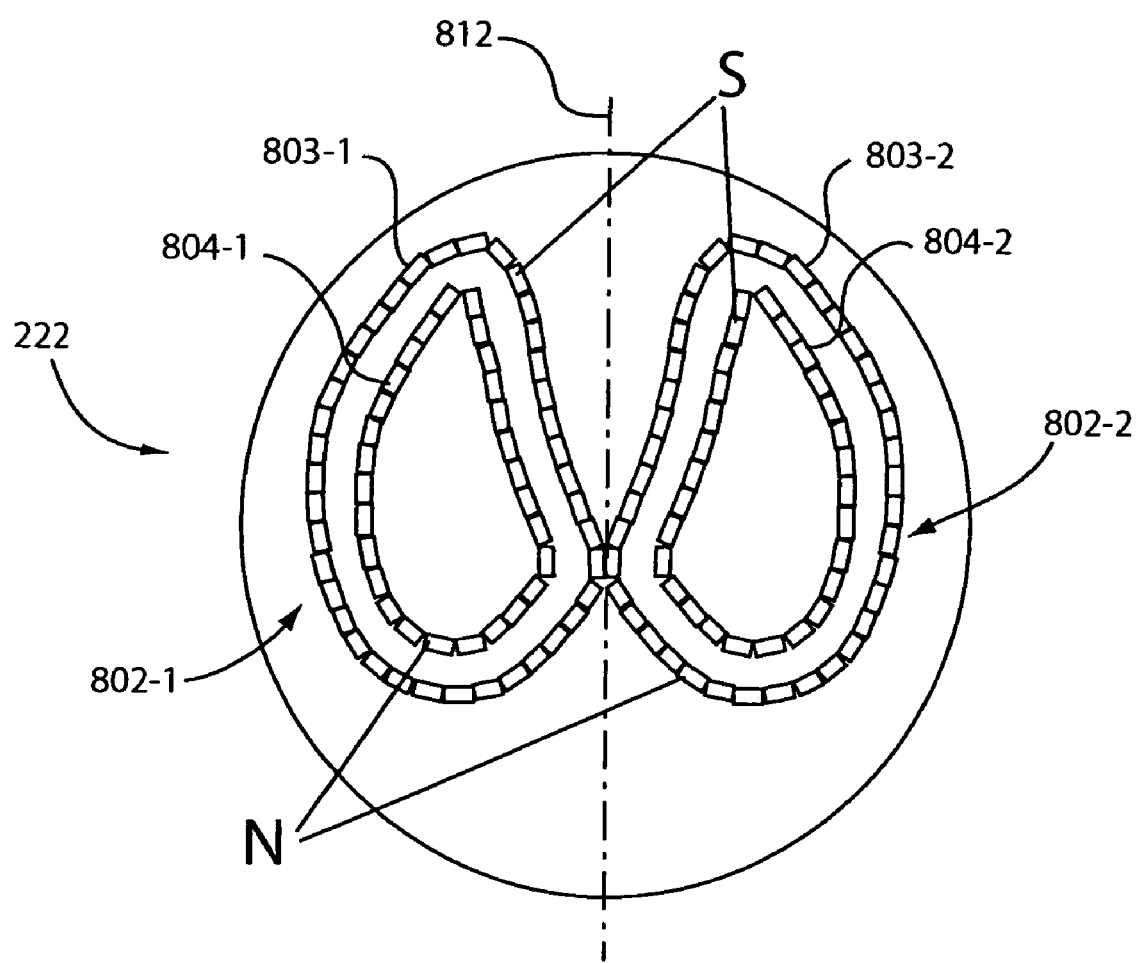
FIG. 8 schematically shows a rotating main magnet assembly with symmetric magnet arrays in accordance with an embodiment of the present invention.

FIG. 8 schematically shows a rotating main magnet assembly 222 in accordance with an embodiment of the present invention. In one embodiment, the main magnet assembly 222 comprises a pair of symmetrically positioned magnet arrays 802 (i.e., 802-1, 802-2). In the example of FIG. 8, the physical configuration of the magnet array 802-1 is a mirror-image of the physical configuration of the magnet array 802-2 about a symmetry axis 812. Physical configuration refers to the physical placement of magnets on the main magnet assembly 222.

Each magnet array 802 may comprise an outer magnet loop 803 (i.e., 803-1, 803-2) and an inner magnet loop 804 (i.e., 804-1, 804-2) that is within the perimeter of the outer magnet loop 803. In the example of FIG. 8, the magnet array 802-1 comprises an outer magnet loop 803-1 and an inner magnet loop 804-1. Likewise, the magnet array 802-2 comprises an outer magnet loop 803-2 and an inner magnet loop 804-2.

In one embodiment, the magnetic configuration of the magnet arrays 802 is such that the inner magnet loop 804-1 and the outer magnet loop 803-2 have the same polarity (N or north facing towards the target in this example), while the inner magnet loop 804-2 and the outer magnet loop 803-1 have the same polarity (S or south facing towards the target in this example). In each magnet array 802, the inner and outer magnet loops have opposite polarity. The magnet array 802-1 generates magnetic fields to form a first plasma discharge path on a target, while the magnet array 802-2 generates magnetic fields to form a second plasma discharge path on the target, with charge particles on the first plasma discharge path moving in a direction opposite to charged particles on the second plasma discharge path.

Figure 9:
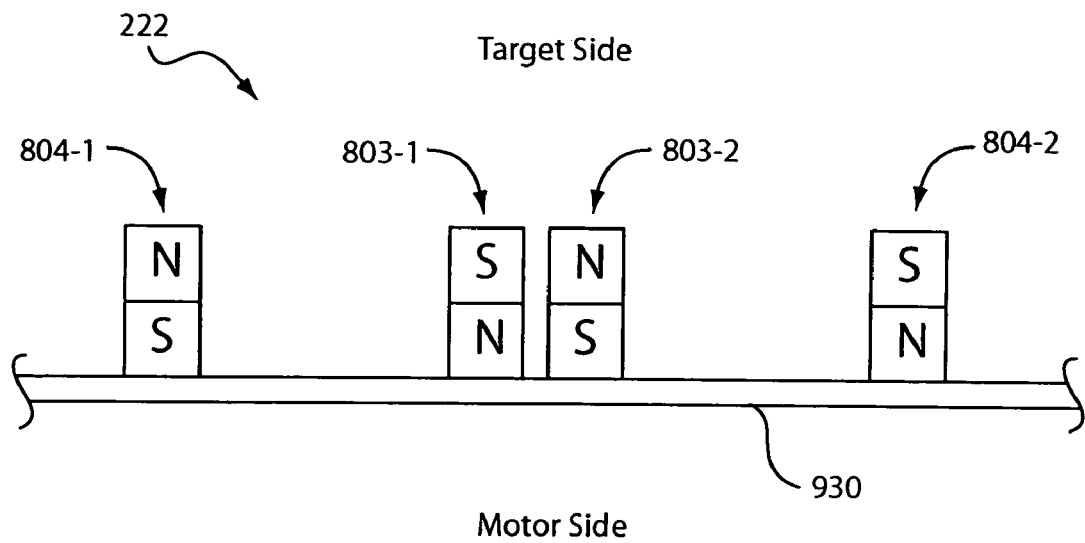
FIG. 9 schematically shows a side view of the main magnet assembly of FIG. 8.

The shape and number of magnets in each magnet array 802 may be adjusted to optimize process uniformity on the wafer, the erosion profile of the target, or both. In the example of FIG. 8, at least one magnet of the outer magnet loop 803-1 touches a magnet of the outer magnet loop 803-2 in the center of the pole plate. Experimentally, this was found to aid target erosion at the center, as well as decrease plasma impendence. The joining of magnet arrays 802 may also be implemented by having one or more magnets common to both magnet arrays. FIG. 9 schematically shows a side view of the center portion of the main magnet assembly 222. In one embodiment, the magnets of the main magnet assembly 222 have a magnetic configuration such that the direction of magnetization on each magnet is perpendicular to a pole plate 930. For example, the magnets of outer magnet loops 803 and inner magnet loops 804 may be mounted such that their north and south poles are vertical with respect to the pole plate 930 as shown in FIG. 9. The magnets of each magnet loop are referred to as looping magnets in that their magnetic fields loop from one magnet to another. In the example of FIG. 9, magnetic fields from the outer magnet loop 803-1 loop to the inner magnet loop 804-1, while magnetic fields from the outer magnet loop 803-2 loop to the inner magnet loop 804-2. In one embodiment, outer magnet loops 803 and inner magnet loops 804 comprise a number of magnets, each having a strength of 45 MGO, a top face dimension of 0.75"×0.375", and a height of 0.640", for example. As shown in FIG. 9, the magnets of the main magnet assembly 222 are on the side of the pole plate 930 facing the target. The other side of the pole plate 930 may be attached to a motor for rotating the main magnet assembly 222.

Figure 1:
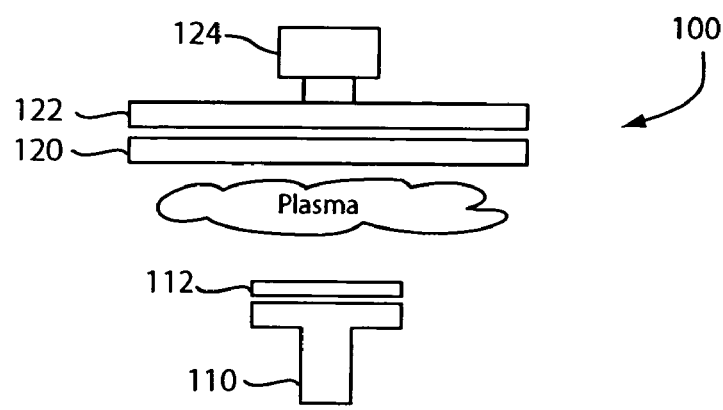
FIG. 1 shows a schematic diagram of an example magnetron sputtering apparatus.
Figure 2:
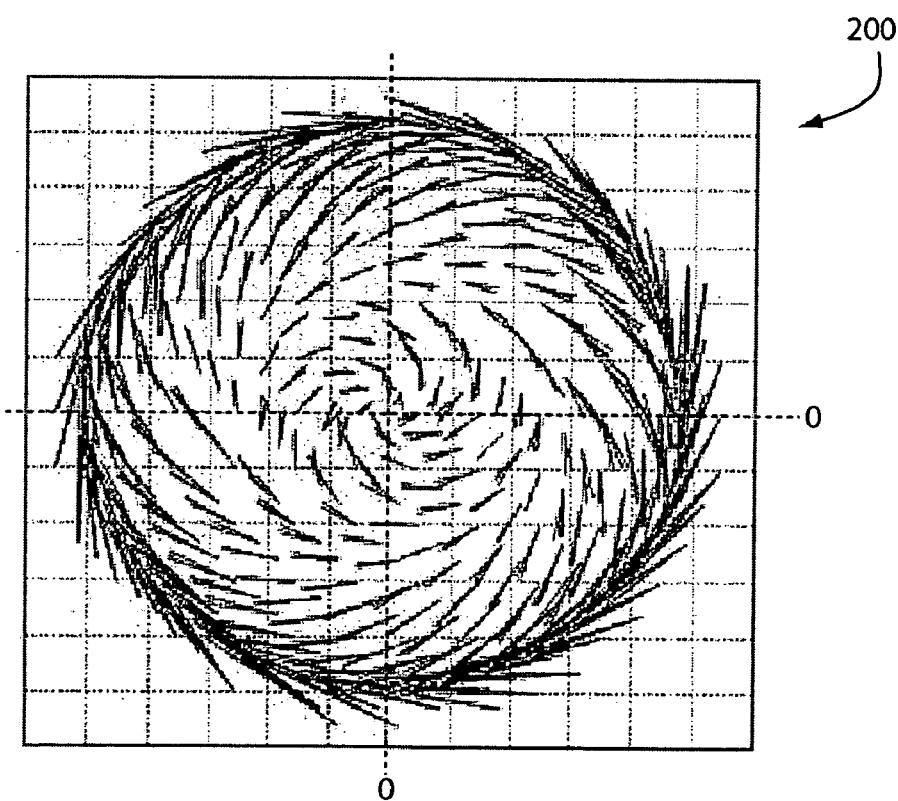
FIG. 2 shows a plot illustrating deposition flux shifting problem in a conventional magnetron sputtering apparatus.

Main magnet assembly 222 may be employed in a variety of magnetron sputtering apparatus without detracting from the merits of the present invention. For example, the main magnet assembly 222 may be employed in the magnetron source disclosed in commonly-assigned U.S. Pat. No. 6,683,425 or as a main magnet of a conventional magnetron apparatus such as that shown in FIG. 1. The main magnet assembly 222 may also be employed in planar physical vapor deposition systems commercially available from Novellus Systems, Inc. of San Jose, Calif., for example.

Figure 10:
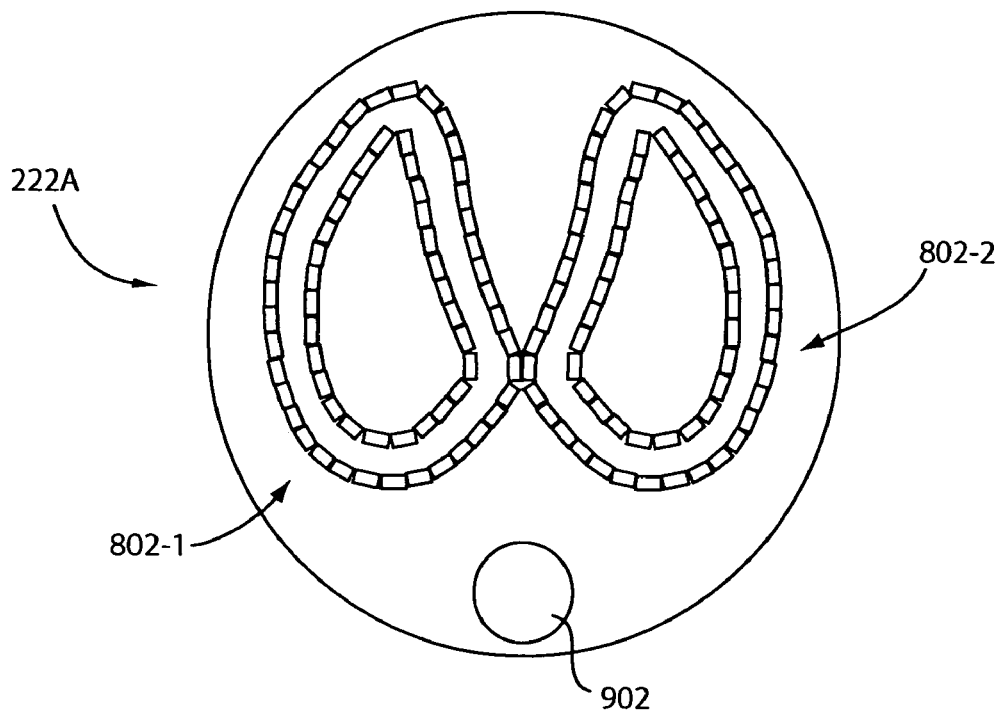
FIG. 10 schematically shows a rotating main magnet assembly in accordance with an embodiment of the present invention.

Although the magnet arrays 802 are symmetrically positioned with respect to one another, the magnet arrays 802 do not necessarily have to be positioned on the center of the pole plate 930. FIG. 10 schematically shows a rotating main magnet assembly 222A in accordance with an embodiment of the present invention. The main magnet assembly 222A is similar to the main magnet assembly 222 shown in FIG. 8 except for the addition of a counterweight 902 for balance. Like the main magnet assembly 222, the main magnet assembly 222A may also include the magnet arrays 802-1 and 802-2.

Figure 11:
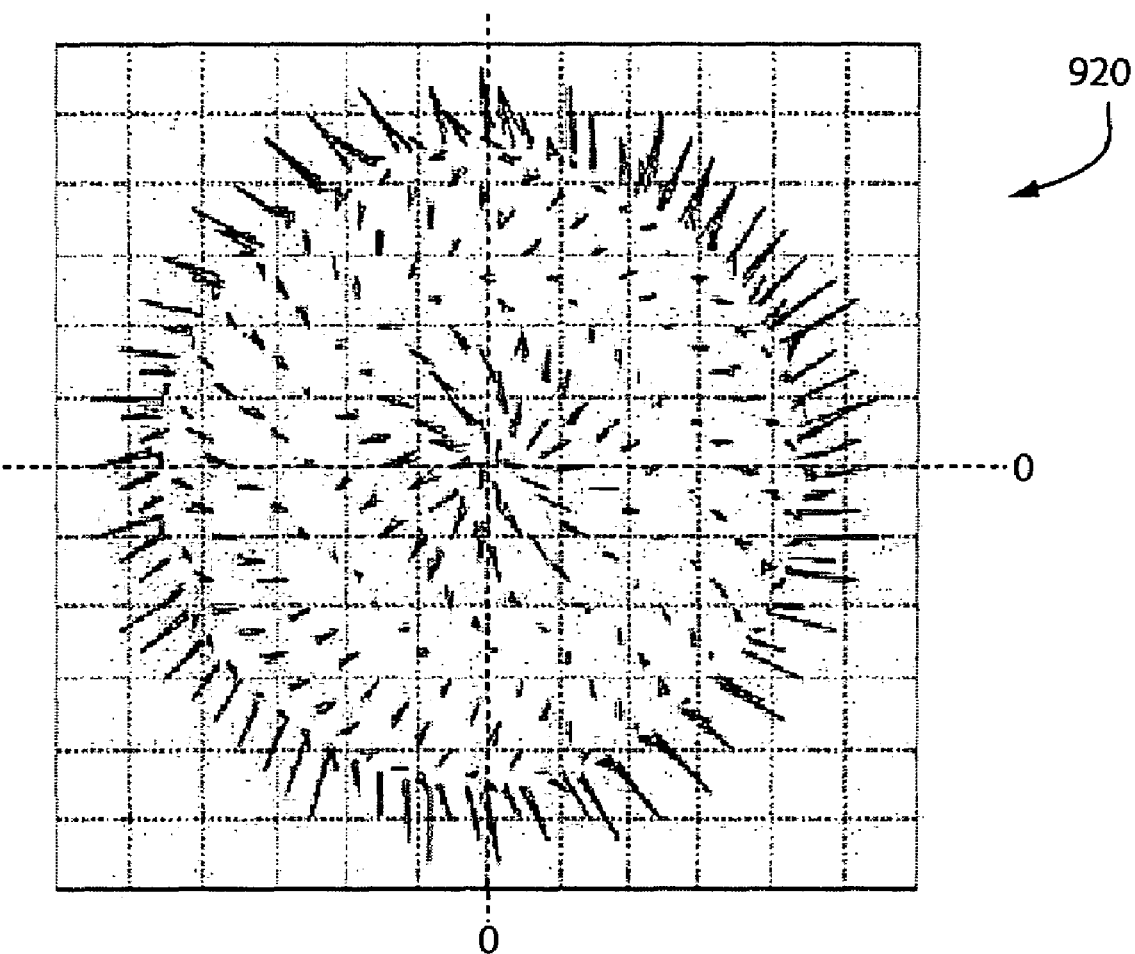
FIG. 11 shows a plot illustrating the elimination of feature shifting that may be achieved using the teachings of the present disclosure.

FIG. 11 shows a plot 920 illustrating reduced rotational shifting that may be achieved using the teachings of the present disclosure. Plot 920 may be achieved by performing physical vapor deposition on a substrate using a magnetron sputtering apparatus that includes the main magnet assembly 222, for example. In the plot 920, the lines inside the chart represent movement of deposition flux on a substrate centered at zero (0,0) coordinates. Compared to the plots 200 (see FIG. 1), the plots 920 have markedly reduced rotational shift. There is still a radial shift, indicated by the vectors aimed away from the wafer center. This issue can be addressed by lithographic techniques much more easily than the rotational shift.

It is to be noted that although the magnet loops disclosed above are symmetric, asymmetric magnet loop designs are also possible in light of the present disclosure. For example, asymmetric magnet loops may be employed so long as the integrated average of their E×B drift contributions are equal and opposite to each other. Portions of the symmetry could also be given up to improve uniformity, but this may require tolerating some degradation due to rotational shift effects.

Figure 12:
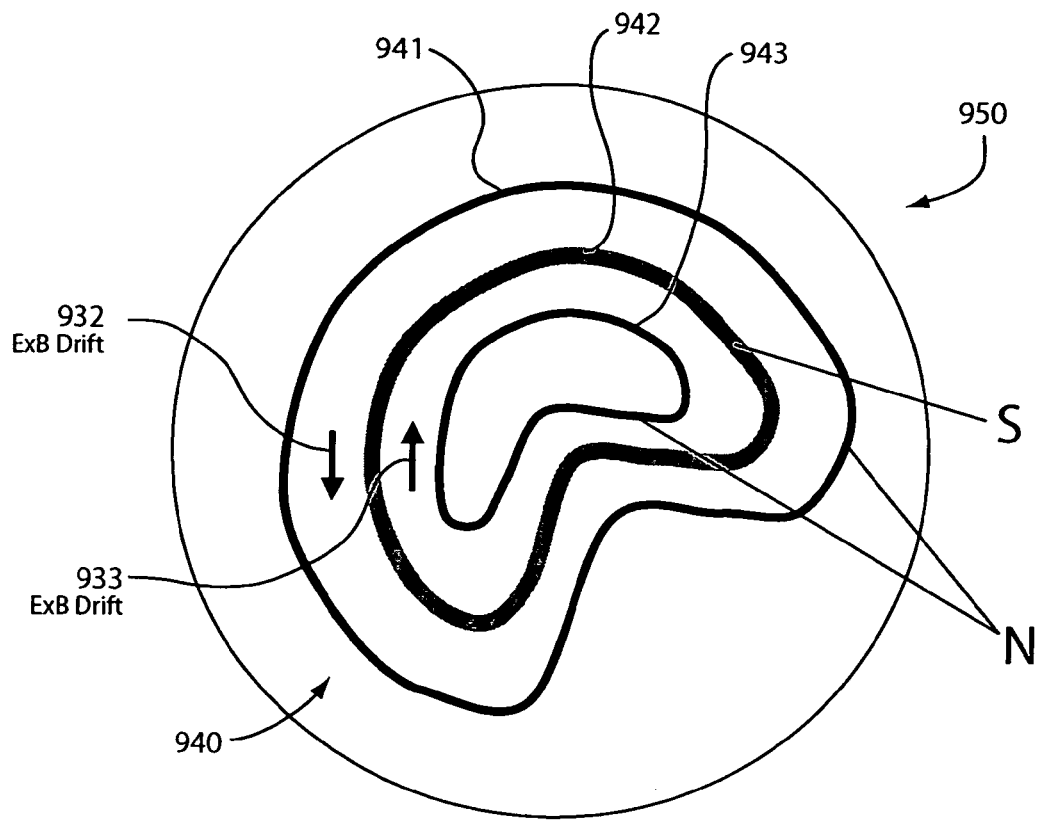
FIG. 12 schematically shows a rotating main magnet assembly with asymmetric magnet arrays in accordance with an embodiment of the present invention.

Conventional main magnet assemblies employ asymmetric designs mainly to minimize film non-uniformity and to maximize target utilization. That is, compared to symmetric magnet arrays, asymmetric magnet arrays generally allow for better uniformity control and erosion profile because they eliminate boundary conditions between two separate magnetic arrays. To allow for better uniformity control and reduced rotational shift, a rotating main magnet assembly 950 shown in FIG. 12 employs an asymmetric design in accordance with an embodiment of the present invention. In the example of FIG. 12, the main magnet assembly 950 comprises a single magnet array 940. In one embodiment, the magnet array 940 comprises an outer magnet loop 941, a center magnet loop 942, and an inner magnet loop 943. Note that the inner magnet loop 943 is within the perimeter of the center magnet loop 942, which in turn is within the perimeter of the outer magnet loop 941. The magnetization of the magnet array 940 is perpendicular to a pole plate 983 (see FIG. 13) of the main magnet assembly 950. The inner magnet loop 943 and the outer magnet loop 941 may have the same magnetic polarity (N or north facing towards the target in this example), while the center magnet loop has a polarity (S or south facing towards the target in this example) opposite to that of the inner magnet loop 943 and outer magnet loop 941. This results in the outer magnet loop 941 and the center magnet loop 942 generating an E×B drift 932 moving charged particles along a first plasma discharge path on the target in one direction, and the center magnet loop 942 and the inner magnet loop 943 generating an E×B drift 933 moving charged particles along a second plasma discharge path on the target in the opposite direction. Note that the second plasma discharge path will be within a perimeter of the first plasma discharge path on the target. The E×B drift 932 covers a larger area of the target compared to the E×B drift 933, so some rotational shift may still be present although reduced. However, one advantage of this asymmetric design is somewhat better process uniformity control compared to symmetric magnet arrays.

Figure 13:
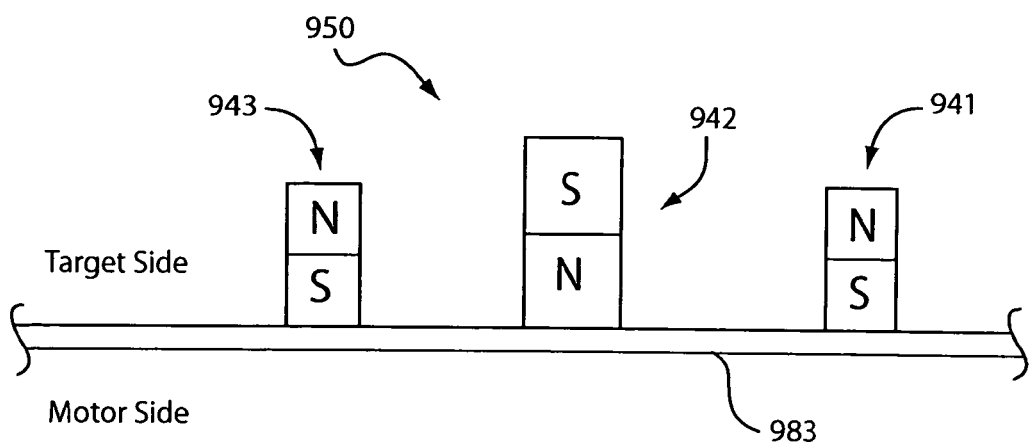
FIG. 13 schematically shows a side view of the main magnet assembly of FIG. 12.

FIG. 13 schematically shows a side view of the main magnet assembly 950. As shown in FIG. 13, the magnet array 940 may have a magnetic configuration such that the direction of magnetization on each of its magnets is perpendicular to the pole plate 983. For example, the magnets of the outer magnet loop 941, the center magnet loop 942, and the inner magnet loop 943 may be looping magnets mounted such that their north and south poles are vertical with respect to the pole plate 983. In the example of FIG. 13, magnetic fields from the outer magnet loop 941 loop to the center magnet loop 942, and magnetic fields from the inner magnet loop 943 also loop to the center magnet loop 942. In one embodiment, the outer magnet loop 941, the center magnet loop 942, and the inner magnet loop 943 comprise several magnets. The magnetic strength of the center magnet loop 942 may be substantially the same as the combined magnetic strengths of the outer magnet loop 941 and inner magnet loop 943. The magnets of the main magnet assembly 930 are mounted on the side of the pole plate 983 facing the target. The other side of the pole plate 983 may be attached to a motor for rotating the main magnet assembly 950.

Improved methods and apparatus for magnetron sputtering have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A magnetron sputtering apparatus comprising:
   a target comprising a material to be deposited onto a substrate;
   a first magnet array comprising a first magnet loop and a second magnet loop inside a perimeter of the first magnet loop, the first magnet loop having a magnetic configuration with a polarity opposite to that of the second magnet loop;
   a second magnet array having a physical configuration that is substantially symmetric with that of the first magnet array, the second magnet array comprising a third magnet loop and a fourth magnet loop inside a perimeter of the third magnet loop, the third magnet loop having a magnetic configuration with a polarity opposite to that of fourth magnet loop but same as that of the second magnet loop; and
   a rotatable magnet assembly configured to generate magnetic fields in the magnetron apparatus using the first magnet array and the second magnet array.

2. The apparatus of claim 1 wherein the first magnet array and the second magnet array comprise looping magnets.

3. The apparatus of claim 1 wherein the first magnet array physically contacts the second magnet array.

4. The apparatus of claim 1 wherein the target comprises a planar target.

5. The apparatus of claim 1 wherein the physical configuration of the second magnet array is substantially a mirror-image of that of the first magnet array.

6. The apparatus of claim 1 wherein a magnet of the first magnet array touches a magnet of the second magnet array.

7. The apparatus of claim 1 wherein the second magnet loop has a magnetic configuration with a polarity opposite to that of the fourth magnet loop but same as that of the third magnet loop.

8. A magnetron sputtering apparatus comprising:

a planar target;

a substrate positioned to receive sputtered material from the target; and a rotating main magnet assembly located behind the target, the rotating magnet assembly comprising magnet arrays that are physically arranged to be substantially mirror-images of one another and configured to have opposite magnetic configurations;

wherein the magnet arrays comprise:

a first magnet loop;

a second magnet loop inside a perimeter of the first magnet loop, the first magnet loop having a magnetic configuration with a polarity opposite to that of the second magnet loop;

a third magnet loop; and a fourth magnet loop inside a perimeter of the third magnet loop, the third magnet loop having a magnetic configuration with a polarity opposite to that of the fourth magnet loop but same as that of the second magnet loop.

9. The apparatus of claim 8 wherein the substrate comprises a semiconductor wafer.

10. The apparatus of claim 8 wherein the second magnet loop has a magnetic configuration with a polarity opposite to that of the fourth magnet loop but same as that of the third magnet loop.

* * * * *